(12) United States Patent
Van Bilsen (10) Patent No.: US 7,651,825 B2
(45) Date of Patent: Jan. 26, 2010

(54) METHOD AND SYSTEM FOR OVERLAY CONTROL USING DUAL METROLOGY SAMPLING

(75) Inventor: Franciscus Bernardus Maria Van Bilsen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 682 days.

(21) Appl. No.: 11/364,541

(22) Filed: Mar. 1, 2006

(65) Prior Publication Data

US 2006/0210893 A1 Sep. 21, 2006

Related U.S. Application Data

(60) Provisional application No. 60/657,383, filed on Mar. 2, 2005.

(51) Int. Cl.
*G03C 5/00* (2006.01)
*G03F 9/00* (2006.01)

(52) U.S. Cl. ............................................. 430/22; 430/30

(58) Field of Classification Search .................. 430/22, 430/30
See application file for complete search history.

(56) References Cited

FOREIGN PATENT DOCUMENTS

| JP | 09-017721 A | 1/1997 |
|---|---|---|
| JP | 2000-299278 A | 10/2000 |
| JP | 2001-033942 A | 2/2001 |
| JP | 2001-093818 A | 4/2001 |
| JP | 2002-064046 A | 2/2002 |
| JP | 2004-119476 A | 4/2004 |

OTHER PUBLICATIONS

English translation of Official Action issued on May 7, 2009 in Japanese Application No. 2006-054592.

*Primary Examiner*—Christopher G Young
(74) *Attorney, Agent, or Firm*—Pillsbury Winthrop Shaw Pittman LLP

(57) ABSTRACT

A system and method are provided for determining an overlay of a first layer N-1 and a second layer N that are positioned one over the other on a substrate. The first layer includes a first overlay portion. The second layer includes a first complementary overlay portion. The first overlay portion and first complementary overlay portion are arranged to form an overlay mark for determining the overlay of the first and second layers. In the second layer a stitching portion and a complementary stitching portion are formed. The stitching portion and complementary stitching portion are arranged to form a stitching mark for determining a stitching overlay between the second layer and an adjacent second layer, with the adjacent second layer being positioned adjacent to the second layer.

8 Claims, 6 Drawing Sheets

METHOD AND SYSTEM FOR OVERLAY CONTROL USING DUAL METROLOGY SAMPLING

CROSS REFERENCE TO RELATED APPLICATIONS

This application claims priority to U.S. Provisional Application No. 60/657,383, filed Mar. 2, 2005, hereby incorporated by reference.

FIELD OF THE INVENTION

The invention relates to a method and system for overlay control using dual off-line metrology sampling. Also, the invention relates to a lithographic apparatus that uses such a method and system for overlay control. Moreover, the invention relates to a method for manufacturing a device using such a method for overlay control.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) of a substrate (e.g. a silicon wafer). The pattern is typically transferred via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the radiation beam through a pattern in a given direction (the "scanning"-direction) while synchronously scanning the substrate in a direction that is parallel or anti-parallel to this direction. It is also possible to transfer the pattern from the patterning device to the substrate by imprinting the pattern onto the substrate.

The target portion or die on the substrate typically contains product structures (for example, microelectronic devices) and a scribe lane surrounding the product structures. The scribe lane provides a sawing groove to be used during the separation of individual dies from the substrate. During the manufacturing process of the product structures, multiple marker structures are placed in the scribe lane to enable process verification, alignment and alignment verification.

Typically, devices on substrates are manufactured by a sequence of lithographic processing steps in which the devices are formed from a plurality of overlaying layers, each having an individual pattern. Between one layer and the next layer that overlays the previous one, the individual patterns of the one layer and the next layer must be aligned. A measure for the alignment is obtained by an overlay metrology tool which utilizes marker structures in the scribe lane. The overlay metrology tool basically determines a position of a marker structure which has been formed in the one layer and a second position of a second marker structure which has been formed in the next layer overlaying the one layer. One example for determining overlay is the box-in-box overlay measurement technique.

When using the aforementioned scanner techniques for exposing each target portion individually (and repeatedly across the substrate), the so-called zero layer (i.e., a base layer) of each target portion must be aligned with respect to its adjacent target portions. To measure this "die-to-die" alignment which is often referred to as stitching overlay (or stitching), the pattern for each target portion comprises stitching overlay mark structures which overlay with complementary stitching overlay mark structures from the adjacent target portions. Again, the overlay of stitching overlay mark structures and a complementary stitching overlay mark structure can be measured by the overlay metrology tool.

Overlay errors of product structures may originate from at least one of a plurality of error sources, which can not be distinguished by the measurement.

Such overlay error sources include an overlay error of a previous exposure tool, an overlay error of a current exposure tool, a matching error between the overlay errors of the previous exposure tool and of the current exposure tool, a process induced overlay error, and an APC thread induced overlay error (APC: Automatic Process Control).

The overlay error of a previous exposure tool relates to an overlay error that is caused by a previous lithographic apparatus that created a layer previous to the next layer created by the current lithographic apparatus.

The overlay error of a current exposure tool relates to an overlay error made by the current lithographic apparatus.

The matching error relates to mismatch between the previous exposure tool and the current exposure tool.

The process induced overlay error relates to processing steps in between lithographic exposure steps. Such processing steps include annealing, deposition, chemical-mechanical polishing, or other processing steps that may have various unpredictable effects on pattern layers placed on the substrate and thus cause overlay related errors.

The APC thread induced overlay error relates to errors originating from automatic process control (APC). An APC tool is introduced in a fab (i.e., the fabrication facility) and is designed to determine the overlay drift on one lot (or batch) of substrates and to correct for the overlay drift on a next lot. For optimum performance one should predict the drift per tool-set (i.e., the actual lithographic apparatus and other tools used) per product and per layer. This optimum situation is attainable if the fab would produce a single product without tool maintenance. In reality, customers may combine the information of multiple tool and or products into a single thread, due to a need to collect enough data for trend analysis. The drawback of this method is that only an average drift for the single thread can be corrected for.

For the most critical layers where the overlay error must be minimal for device portions with minimal feature sizes such as a width of a control gate in a MOSFET, some of these error sources should be eliminated. Because of this, currently a single exposure tool (lithographic apparatus) is selected for the most critical layers as both the "previous" and the "current" exposure tool for the successive exposure steps. Although beneficial for reduction of overlay error, this approach may create many logistics problems in a fab since the distribution of lots over the lithographic tools in the fab during the manufacturing process becomes strongly limited.

SUMMARY

It is desirable to overcome the difficulty of obtaining a single overlay error value for product structures without a differentiation between the various error sources.

According to an aspect of the invention, there is provided a method for determining overlay of a first layer layout and a second layer layout that is manufactured on a substrate by lithographic processing. The first layer layout includes at least one first overlay portion, and the second layer layout includes at least one first complementary overlay portion. The at least one first overlay portion and the at least one first complementary overlay portion may be arranged to form an overlay mark for determining the overlay of the first and second layer layouts, when the second layer layout is located over the first layer layout. The method includes forming, in the second layer layout, a stitching overlay portion and a complementary stitching overlay portion. The stitching overlay portion and the complementary stitching overlay portion may be arranged to form a stitching overlay mark for determining a stitching overlay between the second layer layout and an adjacent second layer layout, the adjacent second layer layout being positioned adjacent to the second layer layout.

Advantageously, the invention enables the various overlay error sources to be distinguished. In contrast, conventional systems provide an average drift for each thread as explained above. Moreover, the invention allows for correction of an overlay error based on the distinguished overlay error sources.

According to an aspect of the invention, there is provided an arrangement of an automated process control loop that includes an automated process control computer system, a lithographic apparatus, and a overlay metrology tool. The automated process control computer system includes a processing unit and memory, the memory being connected to the processing unit. The automated process control computer system may be connected to the computer system of the lithographic apparatus and to the overlay metrology tool. The automated process control loop may be arranged for carrying out a method for determining overlay of a first layer layout and a second layer layout that are manufactured on a substrate by lithographic processing as described above. The automated process control loop may be arranged to form a stitching overlay portion and a complementary stitching overlay portion in the at least scribe lane portion. The stitching overlay portion and the complementary stitching overlay portion may be arranged to form a stitching overlay mark for determining a stitching overlay between the second layer layout and an adjacent second layer layout, the adjacent second layer layout being positioned adjacent to the second layer layout.

According to an aspect of the invention, an overlay metrology tool may be provided that includes a processing unit and memory, wherein the memory is connected to the processing unit. The overlay metrology tool is connected to an automated process control computer system and the overlay metrology tool is arranged to determine overlay of a first layer layout and a second layer layout that is manufactured on a substrate by lithographic processing as described above. The overlay metrology tool may be arranged to establish a process-induced overlay value from overlay value data measured on at least one overlay mark and a performance-related overlay value from stitching overlay value data measured on at least one non-zero layer stitching overlay mark. The overlay metrology tool may send the process-induced overlay value and the established performance-related overlay value to the automated process control computer system.

According to an aspect of the invention, a lithographic apparatus is provided to project a pattern from a patterning device onto a substrate, with a first layer layout and a second layer layout manufactured on the substrate. The first layer layout may include a first device layout portion and a first scribe lane portion. The second layer layout may include a second device layout portion and a second scribe lane portion. The first scribe lane portion may include at least one first overlay portion, the second scribe lane portion may include at least one first complementary overlay portion, wherein the at least one first overlay portion and the at least one first complementary overlay portion may be arranged to form an overlay mark for determining the overlay of the first and second layer layouts, when the second layer layout is located on the first layer layout.

The lithographic apparatus may include a computer system that is connected to an automated process control computer system. The automated process control system may be arranged to determine an overlay of a first layer layout and a second layer layout that are manufactured on the substrate by lithographic processing as described above.

The computer system of the lithographic apparatus is configured to identify a batch to be processed, send a batch information signal to the automated process control system to request data relating to a process-induced overlay value and performance-related overlay value, receive, from the automated process control system, the process-induced overlay value and the performance-related overlay value, and adjust scanner properties in accordance with the received process-induced overlay value and the received performance-related overlay value.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
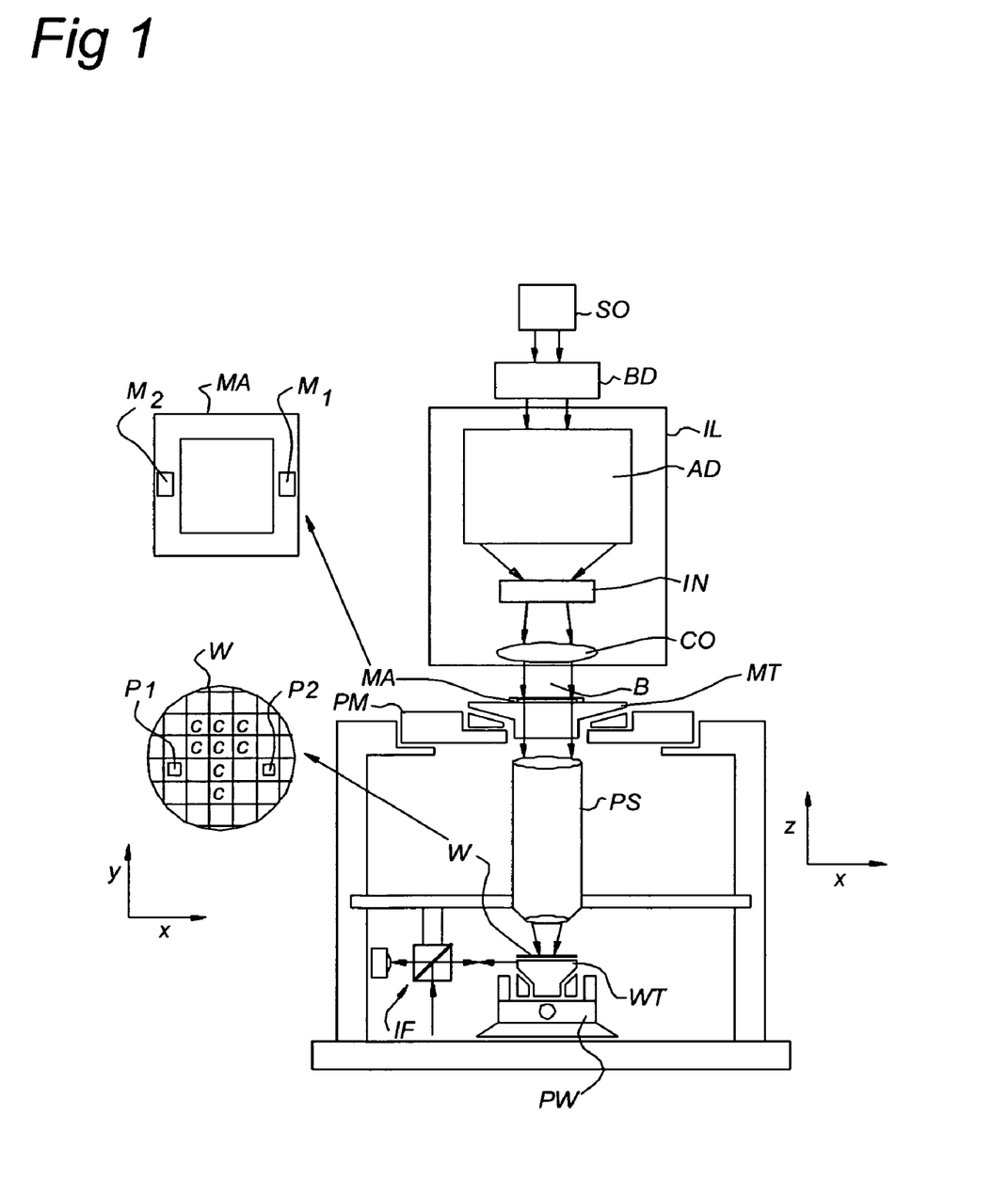
FIG. 1 depicts a lithographic apparatus according to an embodiment of the invention.

FIG. 1 schematically depicts a lithographic apparatus according to one embodiment of the invention. The apparatus includes:

- an illumination system (illuminator) IL configured to condition a radiation beam B (e.g. UV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, controlling or performing other operations on the radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography and include mask types such as binary, alternating phase-shift, attenuated phase-shift and other mask types, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, is submerged in liquid, but rather that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam may be passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator may be used to condition the radiation beam in order to have a desired uniformity and intensity distribution in its cross-section.

The radiation beam B may be incident on the patterning device (e.g., mask MA), which may be held on the support structure (e.g., mask table MT), and may be patterned by the patterning device. Having traversed the mask MA, the radiation beam B may pass through the projection system PS, which focuses the beam onto a target portion C of the substrate W. With the aid of the second positioner PW and position sensor IF (e.g. an interferometric device, linear encoder or capacitive sensor), the substrate table WT may be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT may be kept essentially stationary, while an entire pattern imparted to the radiation beam may be projected onto a target portion C at one time (i.e. a single static exposure). The substrate table WT may be shifted in the X and/or Y direction so that a different target portion C may be exposed. In step mode, the maximum size of the exposure field may limit the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field may limit the width (in the non-scanning direction) of the target portion in a single dynamic exposure, whereas the length of the scanning motion determines the height (in the scanning direction) of the target portion.

3. In another mode, the mask table MT may be kept essentially stationary holding a programmable patterning device, and the substrate table WT may be moved or scanned while a pattern imparted to the radiation beam is projected onto a target portion C. In this mode, generally a pulsed radiation source is employed and the programmable patterning device may be updated after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

It is noted that the present invention relates to any type of lithographic apparatus in which overlay of subsequent layers is to be controlled.

Figure 2:
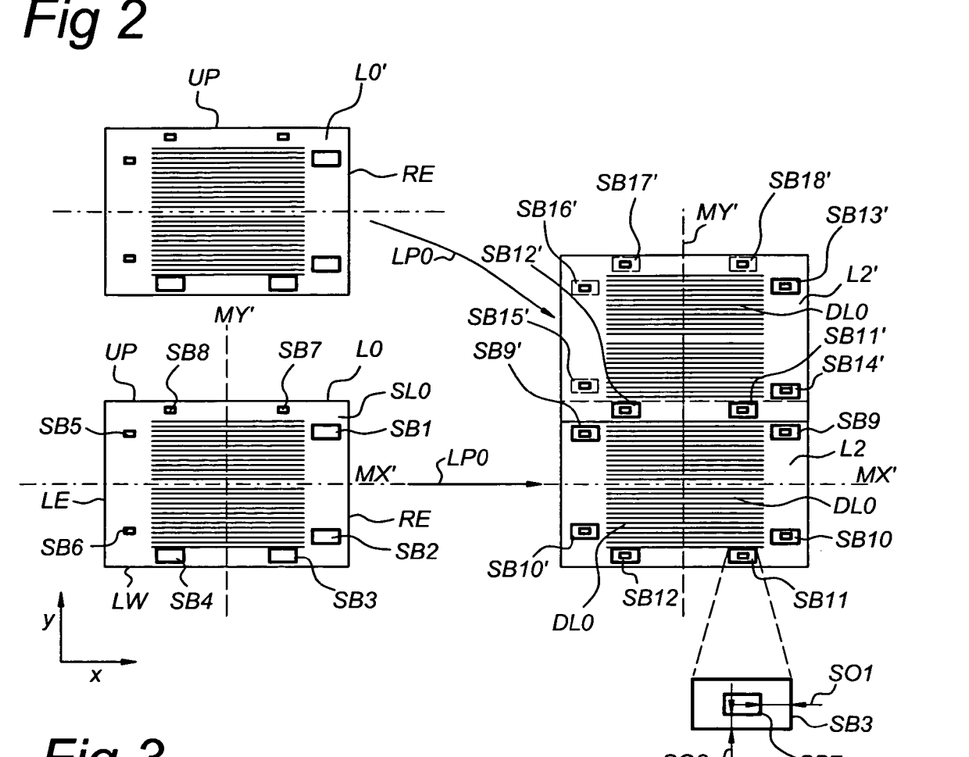
FIG. 2 depicts a schematic diagram of a conventional stitching overlay mask technology.

FIG. 2 depicts a schematic diagram of a conventional stitching overlay mask technology.

As described above, the "die-to-die" alignment is performed in a so-called zero layer or base layer (usually the surface of substrate W).

A reticle that includes a base layer layout L0 is shown for the zero layer which may be created lithographically on the target portion C of substrate W. Coordinate axes MX', MY' for defining a grid on the base layer layout L0 are shown. Coordinate axis MX' extends in a first direction X, second coordinate axis MY' extends in a second direction Y, which is preferably perpendicular to first direction X.

Base layer layout L0 is divided in a portion for a base layer device layout DL0 and a surrounding portion for the scribe lane: base layer scribe lane portion SL0.

Within the base layer scribe lane portion SL0 a plurality of stitching overlay portions SB1, SB2, SB3, SB4 may be provided. Also, a plurality of complementary stitching overlay portions SB5, SB6, SB7, SB8 may be provided. In one embodiment, the stitching overlay portions SB1, SB2, SB3, SB4 and complementary stitching overlay portions SB5, SB6, SB7, SB8 may each have a rectangular shape (or 'box' shape). In another embodiment, stitching overlay portion SB1, SB2, SB3, SB4 may be an outer box, while a complementary stitching overlay portion SB5, SB6, SB7, SB8 in that case may be an inner box.

During exposure of a substrate W in scan mode, the base layer layout L0 may be exposed in repeated sequence which extends in the direction X and in the direction Y. In this way, an array of blocks C, each including the base layer layout L0, may be created as illustrated in FIG. 1.

To perform this scanning exposure operation, the lithographic apparatus may be controlled to have scanning properties which ideally provide a repetition of the base layer layout L0 across the substrate W, having an ideal stitching orientation. Settings on the lithographic apparatus may be adjusted to change the scanning properties.

Note that the same scanning properties may be applied to expose non-zero layer layouts. One difference between a zero layer and a non-zero layer is how alignment is performed. Both layer types require a pre-alignment (the wafer circumference is measured prior to the wafer placement on the wafer stage). For the non-zero layer, alignment is performed by using alignment marks. For the zero layer, alignment is not possible using alignment marks since no alignment marks are present.

Exposure of zero layer layouts will be described in more detail below.

The base layer scribe lane portion SL0 is preferably mirror-symmetric with respect to the coordinate axes MX', MY' so that the width of the base layer scribe portion SL0 on a left-hand edge LE may be equal to the width on a right-hand edge RE. Similarly, the width of the base layer scribe portion SL0 on an upper edge UP may be equal to the width on a lower edge LW.

To reduce the area occupied by scribe lane SL0 on the substrate W, the base layer layout L0 may be exposed on the substrate W in such a way that the right-hand edge portion RE of the base layer scribe lane SL0 in one exposure may overlap with the left-hand portion LE of the base layer scribe lane SL0 in a horizontally adjacent exposure. Also, the lower edge portion LW of the base layer scribe lane SL0 in one exposure may overlap with the upper edge portion UP of the base layer scribe lane SL0 in a vertically adjacent exposure.

Thus, in the scribe lane portion of the base layer layout L0, the arrangement of inner and outer stitching boxes SB1, SB5; SB2, SB6; SB3, SB7; SB4, SB8 that are intended to form a stitching overlay mark may be such that, upon overlap, an inner stitching box SB1; SB2; SB3; SB4 will be located within a corresponding outer stitching box SB5; SB6; SB7; SB8.

The base layer lithographic process for such repeated exposure of the zero layer may be schematically indicated by arrow LP0.

A zero layer layout L2 is shown for the zero layer as created by the base layer lithographic process LP0. In the lithographic apparatus, the zero layer L2 may be defined in each target portion C. Within one target portion C the base layer device layout DL0 may be created to be surrounded by the base layer scribe lane portion SL0, in which a plurality of stitching overlay marks SB9, SB10, SB11, SB12 may be located. By using the overlap of the right edge RE and left edge LE scribe lane portions and of the lower edge LW and upper edge UP scribe lane portions, each stitching overlay mark SB9; SB10; SB11; SB12 may include a stitching overlay portion or outer stitching box SB1; SB2; SB3; SB4 and a corresponding complementary stitching overlay portion or inner stitching box SB5; SB6; SB7; SB8. In one embodiment, the outer stitching box may originate from one exposure of the base layer layout L0 to create the target portion C, and the inner stitching box may originate from an exposure of an adjacent target portion. The scribe lane portions of the target portion and the adjacent target portion may partially overlap on the right RE and left LE edges or the upper UP and lower LW edges, respectively.

In one exemplary embodiment, an overlap is shown of the upper edge UP of zero layer L2 and the lower edge of an adjacent zero layer L2'. For reasons of clarity, the adjacent zero layer L2' illustrates the envelope by a dashed line.

Note that also a plurality of additional stitching overlay marks SB9', SB10', SB11', SB12' may be located in the base layer scribe lane portion SL0 due to the aforementioned overlap. Typically the locations of the additional stitching overlay marks SB9', SB10', SB11', SB12' may be symmetric to the locations of the stitching overlay marks SB9, SB10, SB11, SB12 with the coordinate axes MX', MY' being lines of symmetry.

As indicated for stitching overlay mark SB11, which consists of outer stitching box SB3 and inner stitching box SB7, the stitching overlay may be measured from the position of inner stitching box SB7 compared with the position of the outer stitching box SB3.

The stitching overlay measurement of stitching overlay mark SB11 may be indicated in the X-direction by line SO1, in the Y-direction by line SO2. As known by persons skilled in the art, overlay metrology tools are capable of determining measurements for the stitching overlay from positions of the outer and inner stitching boxes within the stitching overlay mark.

Figure 3:
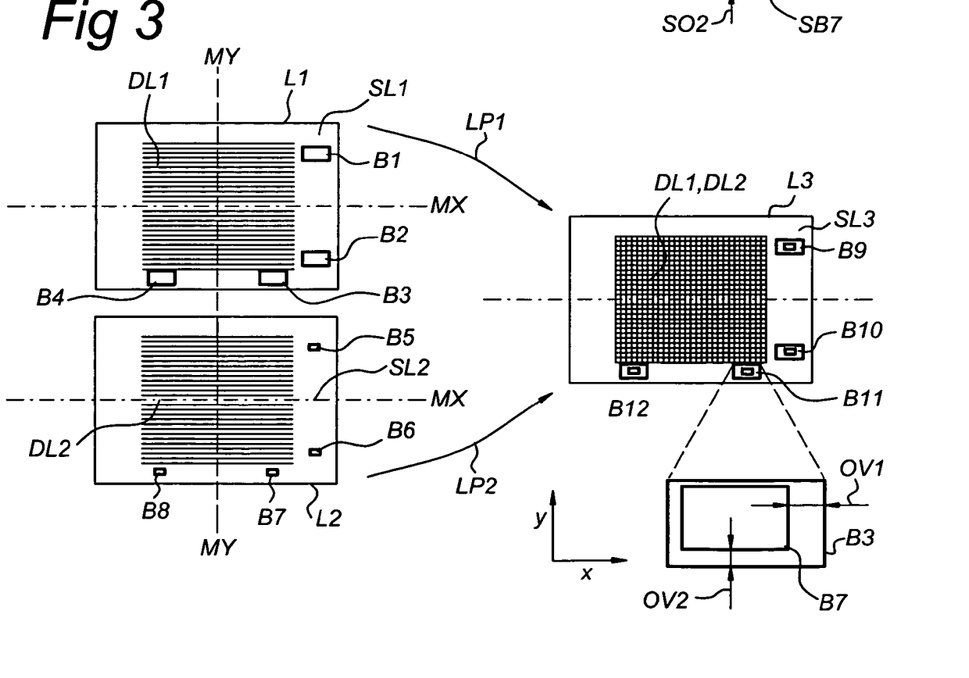
FIG. 3 depicts a schematic diagram of a conventional overlay mask technology.

FIG. 3 depicts a schematic diagram of a conventional overlay mask technology.

A reticle of a first layout L1 is shown for a layer N-1 which may be created lithographically on the target portion C of substrate W.

First layout L1 may be divided in a portion for a first device layout DL1 and a second surrounding portion for the scribe lane: first scribe lane portion SL1.

First and second coordinate axes MX, MY are shown for defining a grid on the first layout L1. First coordinate axis MX extends in a first direction X, second coordinate axis MY extends in a second direction Y, which is perpendicular to first direction X.

Within the first scribe lane portion SL1 a plurality of overlay portions B1, B2, B3 and B4 may be provided. In one embodiment, these overlay portions B1, B2, B3, B4 may have a rectangular shape, often referred to as a box shape.

In one embodiment, to preserve space for the scribe lanes positioned between target portions C, only half the scribe lane portion is used for markers. By creating them as shown in FIG. 3 in the right-hand and lower regions of the first scribe lane portion SL1, the scribe lane of a target portion C and an adjacent target portion C may be made to not overlap, resulting in the identical scribe lane width on the wafer. This is well known to persons skilled in the art.

It is noted that, alternatively, all scribe lane portions may be exposed, but that typically in that case the scribe lanes do not overlap. With respect to this option, in total multiple options exist with either 0, 1, 2, 3 or all four scribe lane portions overlapping.

Note that first layout L1 may relate to either a zero layer or a non-zero layer on the substrate W.

A reticle of a second layout L2 is shown for a further non-zero layer N which may be created lithographically on the layer N-1 on the target portion C of substrate W.

The second layout L2 may be divided in a portion for a second device layout DL2 and a surrounding portion for the scribe lane: second scribe lane portion SL2. Again, first and second coordinate axes MX, MY for defining a grid on the second layout L2 are shown. The grid in the X-Y plane on second layout L2 may be identical to the grid on the first layout L1.

Substantially, the second scribe lane portion SL2 may occupy an area of the second layout L2 that is equal to an area as occupied by the first scribe lane portion SL1 on the first layout L1.

Within the second scribe lane portion SL2 a plurality of complementary overlay portions B5, B6, B7 and B8 may be provided.

In one embodiment, the complementary overlay portions B5, B6, B7 and B8 may be inner overlay portions that, when the second layout L2 is placed on top of the first layout, the corresponding complementary overlay portions may be located within the overlay portions B1, B2, B3, B4. Similar to the overlay portions B1, B2, B3, B4, the complementary overlay portions B5, B6, B7, B8 may have a rectangular (or 'box') shape. Also, the complementary overlay portions may be provided in the right-hand and lower regions of the second scribe lane portion SL2.

Due to the grid that is provided on both the first and second layout L1, L2, the location of the overlay portions (e.g. outer overlay boxes) B1, B2, B3, B4 and complementary overlay portions (e.g. inner overlay boxes) B5, B6, B7, B8 may be selected and arranged so as to form overlay marks each including a complementary overlay portion or inner box B5; B6; B7; B8 and an overlay portion or outer overlay box B1; B2; B3; B4 when the layer N created from the second layout L2 is overlayed on the layer N-1 created from the first layout L1.

Furthermore, the location of the inner and outer overlay boxes may be governed by the symmetry of the repeated sequence of exposures in X- and Y-direction and the scribe lane overlap, as explained earlier with reference to the stitching overlay marks of FIG. 2.

Indicated diagrammatically by arrows LP1 and LP2, the first and second layouts may be lithographically processed by a first lithographic process LP1 and a second lithographic process LP2, respectively. As a result, a third layout L3 may be formed on substrate W.

Third layout L3 may be shown for the layers N-1 and N being stacked on top of each other.

Third layout L3 may be divided in a portion for the first and second device layout DL1, DL2 (as stacked on each other) and a surrounding portion for the scribe lane: third scribe lane portion SL3. The third scribe lane portion SL3 may substantially coincide with the first and second scribe lane portions SL1, SL2.

Within third scribe lane portion SL3, a plurality of overlay marks B9, B10, B11, B12 may be provided. Each of the overlay marks B9; B10; B11; B12 may be composed of an overlay portion or outer overlay box B1; B2; B3; B4 as created from the first layout L1 in the first lithographic process LP1 and a complementary overlay portion or inner overlay box B5; B6; B7; B8 as created from the second layout L2 in the second lithographic process LP2.

As indicated for overlay mark B11, which includes outer overlay box B3 and inner overlay box B7, the overlay may be measured from the position of inner overlay box B7 compared with the position of the outer overlay box B3.

The location of the overlay measurement of overlay mark B11 may be indicated in X-direction by line OV1, in Y-direction by line OV2. Typically, the overlay may be determined by measurement of the difference of the center positions of the outer and inner overlay boxes, respectively. As known by persons skilled in the art, overlay metrology tools are capable of determining a measure for the "layer-to-layer" overlay from the positions of the outer and inner overlay boxes within the overlay mark.

It is noted that the measurement of stitching (or "die-to-die") overlay is similar to the "layer-to-layer" overlay as shown in FIG. 2.

Figure 4:
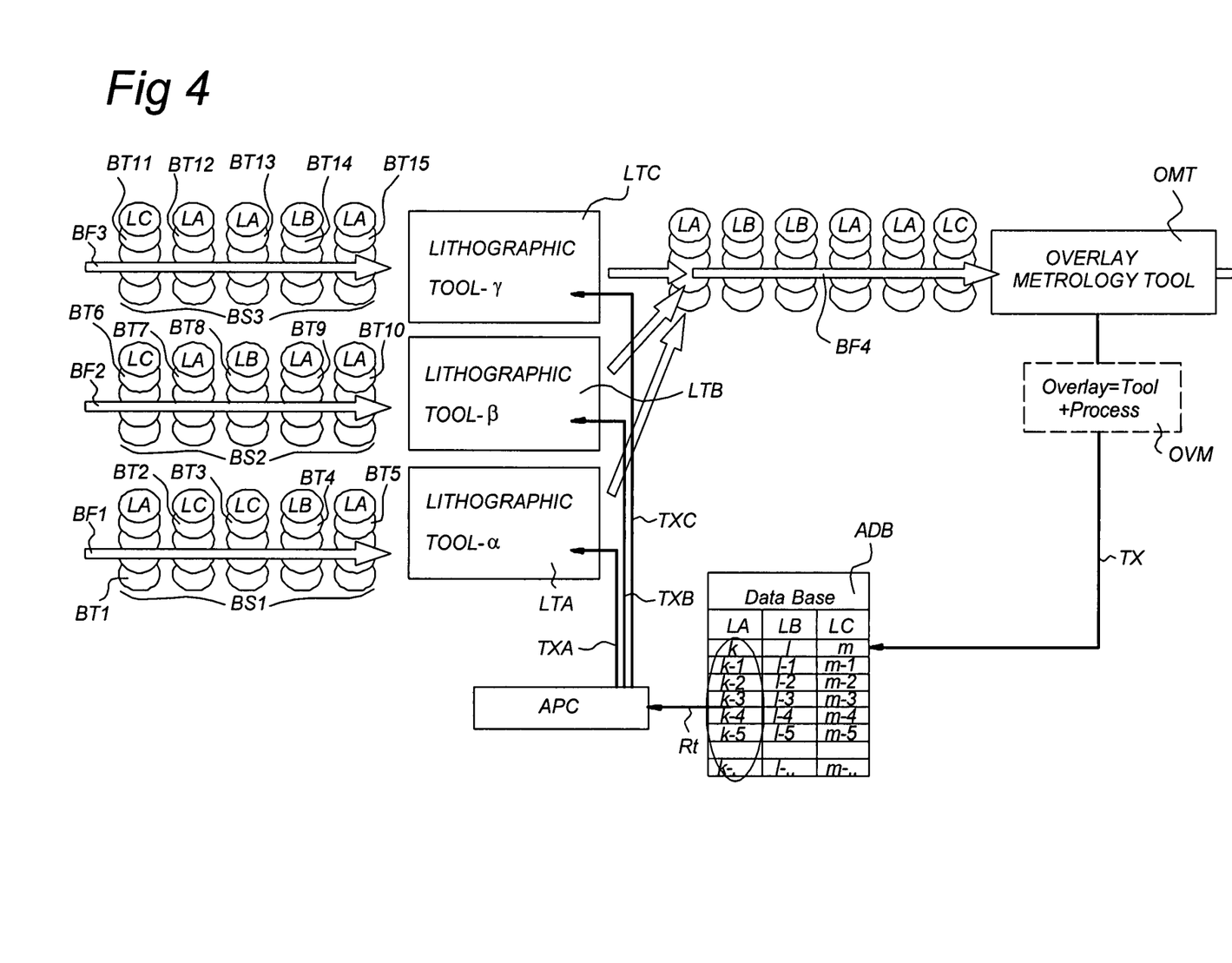
FIG. 4 depicts a schematic diagram of a conventional overlay metrology system and method.

FIG. 4 depicts a schematic diagram of a conventional overlay metrology system and method.

The conventional overlay metrology system and method is typically implemented by an automated process control loop within a fabrication facility. Such a fabrication facility typically includes a number of lithographic apparatus that are each capable of performing a lithographic process on substrates W. Also, other processing equipment for additional processes such as ion implantation for active, deposition of insulating or conductive layers, (reactive ion) etching, chemical-mechanical polishing, and passivation which may affect the alignment, are typically utilized. Further, an automated process control system APC (or APC tool) may be utilized in the control loop to determine overlay (drift) on one lot (or batch) of substrates and provide corrections for a next lot.

In such a control loop of the fabrication facility, a first batch flow BF1 is present for a first set BS1 of a plurality of batches BT1, BT2, BT3, BT4, BT5 of substrates which are to be processed on a first lithographic apparatus LTA.

A second batch flow BF2 is present for a second set BS2 of a plurality of batches BT6, BT7, BT8, BT9, BT10 of substrates which are to be processed on a second lithographic apparatus LTB.

A third batch flow BF3 is present for a third set BS 3 of a plurality of batches BT11, BT12, BT13, BT14, BT15 of substrates which are to be processed on a third lithographic apparatus LTC.

In the conventional example of FIG. 4, a plurality of different product layers to be created (as referenced by LA, LB and LC) is distinguished.

The (product) layer LA, LB, LC which is to be created by the first, second or third lithographic apparatus LTA, LTB, LTC is indicated in FIG. 4 for each batch BT1; . . . ; BT15 in each set of batches BS1; BS2; BS3.

After lithographic processing, all batches BT1; . . . ; BT15 as processed by the lithographic apparatus LTA, LTB, LTC are fed into a fourth batch flow BF4, which is directed to the overlay metrology tool OMT.

The overlay metrology tool OMT determines for each batch BT1; . . . ; BT15 the overlay for the specific layer LA; LB; LC created in that batch on one of the lithographic apparatus LTA; LTB; LTC, the overlay may be determined either with respect to a further layer below the specific layer created in case of "layer-to-layer" overlay or with respect to adjacent target portions in case of stitching overlay. Typically, one or more sample substrates may be taken from a batch and, for such a sample substrate, the overlay is measured on the overlay marks by the overlay metrology tool OMT.

In one embodiment, the overlay metrology tool OMT determines the overlay for each batch with aid of an overlay model OV-M. In another embodiment the measured data may be retrieved by the APC tool to determine the overlay with the aid of the overlay model OV-M. The value of the determined overlay encompasses both process-related overlay and performance-related overlay relating to the actual setting of the lithographic apparatus used in the lithographic processing. Note that the value of the determined overlay may be determined in both X and Y-directions. Also, the overlay may be parameterized.

The overlay metrology tool OMT transmits (arrow Tx) the determined overlay values for each specific layer LA; LB; LC to an automated process control system APC, typically a computer system. Such computer system APC will be described in more detail with reference to FIG. 7.

The automated process control system APC may store the overlay values transmitted by the overlay metrology tool OMT in an automated process control database ADB. Data in this automated process control database ADB may be used later for correction of the lithographic apparatus LTA; LTB; LTC that are used to create corresponding layers LA; LB; LC.

The results of the overlay measurements performed by the overlay metrology tool OMT may be stored in an automated process control database ADB. In such an automated process control database ADB, for each layer LA; LB; LC created by the lithographic apparatus LTA; LTB; LTC the value (or values or parameters) of the overlay may be stored for each batch BT1; . . . ; BT15. In the automated process control database ADB, the overlay of each batch with layer LA, LB, LC may be ranked by index k, l, m, respectively, with k, l, m being the most recent measured overlay values.

Subsequently, the automated process control system APC may use the values stored in the automated process control database ADB for each layer LA; LB; LC to be created during lithographic processing on each lithographic apparatus as a function of the actual layer to be created by the lithographic apparatus. The automated process control system APC may retrieve (arrow Rt) the relevant overlay value(s) for a layer LA; LB; LC from the automated process control database ADB (in accordance with the schedule for a batch to be processed on a specific lithographic apparatus). Next, the automated process control system APC may transmit (arrow TXA; TXB; TXC) the relevant overlay data to the specific lithographic apparatus LA; LB; LC.

The method for data transmission in the fabrication facility between the overlay metrology tool OMT and the automated process control system APC, and between the automated process control system APC and the lithographic apparatus LA; LB; LC may be implemented in several ways which are known to persons skilled in the art.

As explained here, the information of multiple tool (=lithographic apparatus) and/or product layers (=LA; LB; LC) may be combined into three threads (for each product layer), basically due to a need to collect enough data for trend analysis. One drawback of this method is that only an average drift for each thread may be corrected. As described above, the conventional overlay metrology system and method cannot distinguish between process-induced (i.e. the processes involved in creating a device structure) overlay errors and performance-related overlay errors induced by the performance of a lithographic apparatus.

Figure 5:
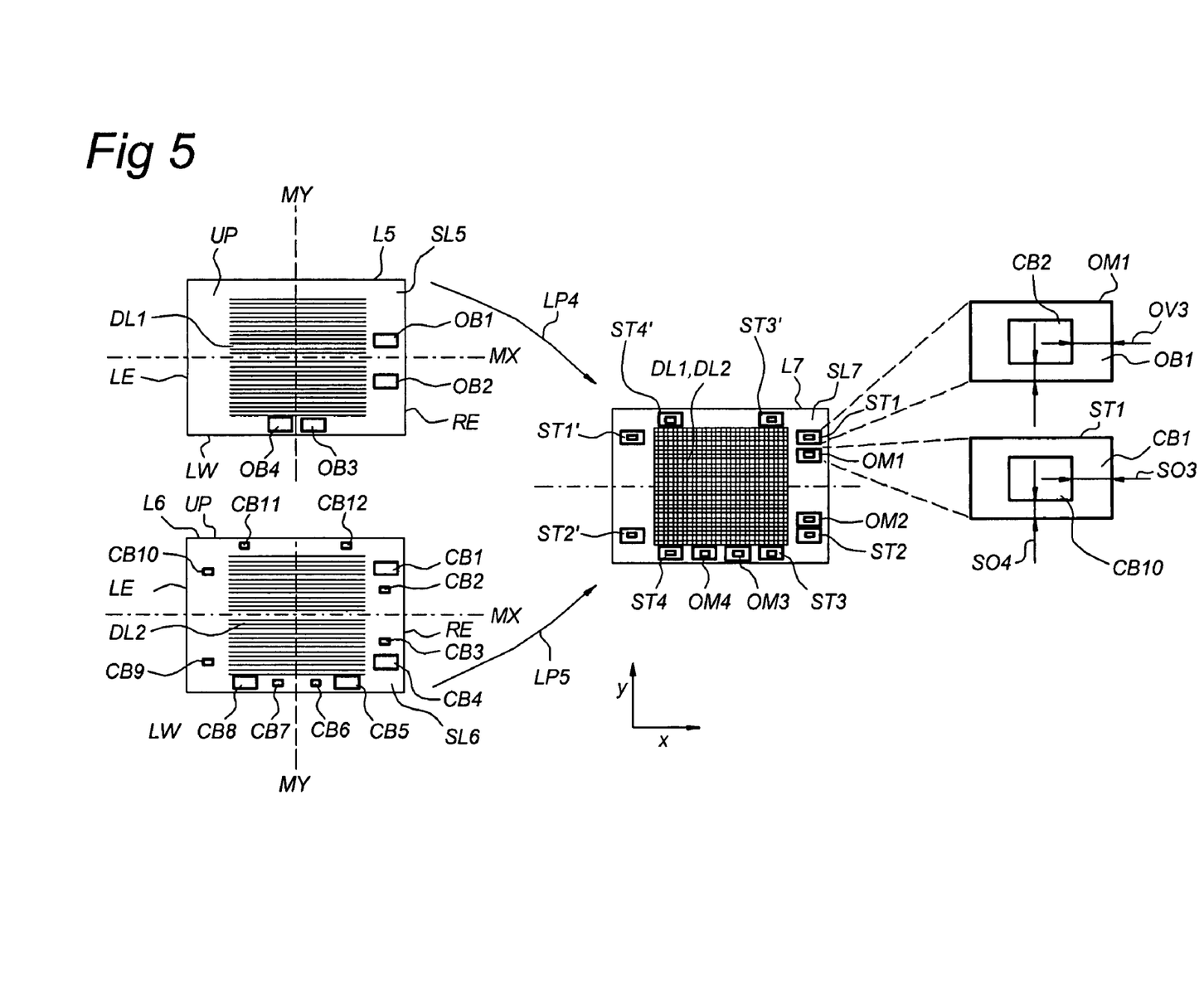
FIG. 5 depicts a schematic diagram of an overlay and stitching mask technology in accordance with the present invention.

FIG. 5 depicts a schematic diagram of an overlay and stitching mask technology in accordance with the invention.

The invention provides a technique to distinguish between various overlay error sources rather than providing an average drift for each thread as explained above. Moreover, the invention allows correction of overlay error as a function of the distinguished overlay error sources.

A reticle of a fifth layout L5 is shown for a layer N-1 which may be created lithographically on the target portion C of substrate W. First and second coordinate axes MX, MY are shown for defining a grid on the fifth layout L5. First coordinate axis MX may extend in a first direction X, second coordinate axis MY may extend in a second direction Y, which is perpendicular to first direction X.

Fifth layout L5 may be divided in a portion for a first device layout DL1 and a surrounding portion for the scribe lane: fifth scribe lane portion SL5.

Within the fifth scribe lane portion SL5 at least a plurality of overlay portions OB1, OB2, OB3, OB4 may be provided. The overlay portions OB1, OB2, OB3, OB4 may be located in the right-hand RE and lower LW regions of the fifth scribe lane portion SL5. The overlay portions OB1, OB2, OB3, OB4 may have a rectangular shape (or 'box' shape).

Note that the layer N-1 may be either a zero layer or a non-zero layer on the substrate W.

A reticle of a sixth layout L6 is shown for a further non-zero layer N which may be created lithographically over the layer N-1 on the target portion C of substrate W.

First and second coordinate axes MX, MY are shown for defining a grid on the sixth layout L6. First coordinate axis MX extends in a first direction X, second coordinate axis MY extends in a second direction Y, which is preferably perpendicular to first direction X. The grid in the X-Y plane on the sixth layout L6 may be identical to the grid on the fifth layout L5.

Sixth layout L6 may be divided in a portion for a second device layout DL2 and a surrounding portion for the scribe lane: sixth scribe lane portion SL6.

Within the sixth scribe lane portion SL6 a plurality of overlay portions and complementary overlay portions CB1, CB2, CB3, CB4, CB5, CB6, CB7, CB8, CB9, CB10, CB11, CB12 may be provided.

In one embodiment, the overlay portions and the complementary overlay portions may have a rectangular (or box) shape. The complementary overlay portions in that case may be inner overlay boxes CB2, CB3, CB6, CB7, CB9, CB10, CB11, CB12, while the overlay portions may be outer overlay boxes CB1, CB4, CB5, CB8.

The inner and outer overlay boxes CB1, CB2, CB3, CB4, CB5, CB6, CB7, CB8, CB9, CB10, CB11, CB12 may be located in the right-hand RE, the left-hand LE, upper UP and lower LW regions of the sixth scribe lane portion SL6.

The purpose of the overlay portions OB1, OB2, OB3, OB4 of the fifth layout L5 and the inner and outer overlay boxes CB1, CB2, CB3, CB4, CB5, CB6, CB7, CB8, CB9, CB10, CB11, CB12 of the sixth layout L6 are two-fold.

Some outer and inner boxes may be defined to form an overlay mark when a layer of the sixth layout L6 is created above a layer of the fifth layout L5.

Other inner and outer boxes may be defined to form a stitching overlay mark in the sixth layout L6 with an adjacent layout (i.e., the sixth layout itself), when the lithographic apparatus is carrying out the repeated exposure of the sixth layout L6 across the substrate W in the aforementioned scan mode.

The arrangement of inner and outer boxes in the fifth and sixth scribe lane portions SL5, SL6 depends on the desired function: overlay or stitching overlay.

For overlay, the inner and outer boxes in the fifth and sixth layout L5, L6 may be arranged in identical locations of the fifth and sixth scribe lane portions, for example, the inner boxes CB6, CB7 in the lower edge LE of the sixth layout L6 and the outer boxes OB3, OB4 at the same positions in the lower edge LE of the fifth layout L5 or vice versa.

For stitching overlay, the inner boxes CB9, CB10, CB11, CB12 and outer boxes CB1, CB4, CB5, CB8 in the sixth layout L6 may be arranged in opposite locations in the sixth scribe lane portion SL6 as mirrored by the axes MX or MY. For example, the inner boxes CB9, CB10 in the left-hand portion LE and the outer boxes CB4, CB1 in the right hand portion RE of the sixth scribe lane SL6 or vice versa.

Note that instead of the illustrated embodiment having stitching overlay marks and overlay marks including inner and outer boxes, the stitching overlay marks and overlay marks may comprise any type of structure defined by a first mark portion and a second mark position. Of such a structure, the first mark portion may be printed in a first lithographic processing step and the second mark portion may be printed in a second lithographic processing step. Moreover, the first mark portion and the second mark portion may not create a joint (stitching) overlay mark of a box in a box as shown here, but may be located at some distance from each other. For the purpose of measuring overlay or stitching overlay the distance between first and second mark portions may be determined. Any deviation from that distance between first and second mark portions may be indicative of a quality of the overlay or stitching overlay.

Indicated diagrammatically by arrows LP4 and LP5, the fifth and sixth layouts L5, L6 may be lithographically processed by a fourth lithographic process LP4 and a fifth lithographic process LP5, respectively. As a result a seventh layout L7 may be formed on substrate W.

Seventh layout L7 is shown for the layers N-1 and N being stacked on top of each other.

Seventh layout L7 may be divided in a portion for the first and second device layout DL1, DL2 (as stacked on each other) and a surrounding portion for the scribe lane: seventh scribe lane portion SL7.

Within seventh scribe lane portion SL7, a plurality of overlay marks OM1, OM2, OM3, OM4 and a plurality of non-zero layer stitching overlay marks ST1, ST2, ST3, ST4, ST1', ST2', ST3', ST4' may be provided. Each of the overlay marks OM1, OM2, OM3, OM4 may be composed of an overlay portion or outer overlay box OB1; OB2; OB3; OB4 as created from the fifth layout L5 in the fourth lithographic process LP4 and a complementary overlay portion or inner overlay box CB2; CB3; CB6; CB7 as created from the sixth layout L6 in the fifth lithographic process LP5.

Each of the non-zero layer stitching overlay marks ST1, ST2, ST3, ST4 may be composed of a stitching overlay portion or outer stitching overlay box CB1; CB4; CB5; CB8 and a complementary stitching overlay portion or inner stitching overlay box CB10; CB9; CB12; CB11 both as created from the sixth layout L6 in the fifth lithographic process LP5.

The non-zero layer stitching overlay marks ST1', ST2', ST3', ST4' originate from overlap of the sixth layout L6 with adjacent exposures of the sixth layout on adjacent target portions C on the substrate W.

As indicated for overlay mark OM1 which includes outer overlay box OB1 and inner overlay box CB2, the overlay may be measured from the position of inner overlay box CB2 compared with the position of the outer overlay box OB1. The location of the overlay measurement of overlay mark OM1 may be indicated in the X-direction by line OV3, and in the Y-direction by line OV4.

As indicated for non-zero layer stitching overlay mark ST1 this mark includes outer stitching overlay box CB1 and inner stitching overlay box CB10, the stitching overlay may be measured from the position of inner stitching overlay box CB10 compared with the position of the outer stitching overlay box CB1. The location of the overlay measurement of stitching overlay mark ST1 may be indicated in the X-direction by line SO3, and in the Y-direction by line SO4.

Note that the non-zero layer stitching overlay marks ST1, ST2, ST3, ST4, ST1', ST2', ST3', ST4' are defined here in the scribe lanes. It is conceivable to define the non-zero layer stitching overlay marks ST1, ST2, ST3, ST4, ST1', ST2', ST3', ST4' in any portion of a reticle. Similarly, the overlay marks OM1, OM2, OM3, OM4 according to the invention may be defined in any portion of the reticle.

As known by persons skilled in the art, overlay metrology tools are capable of determining a measure for the overlay or stitching overlay from the positions of the outer and inner (stitching) overlay boxes within the (stitching) overlay mark.

Advantageously, the creation of overlay marks and non-zero layer stitching overlay marks allows information to be obtained on overlay error that is capable of distinguishing errors relating to processing and errors relating to performance of a lithographic apparatus (or tool).

Note that in case the fifth layout L5 relates to a non-zero layer, the scribe lane portion of the fifth layout may include both overlay portions and stitching overlay portions in a similar way as the sixth layout. Thus, stitching overlay of the fifth layout may be determined.

Figure 6:
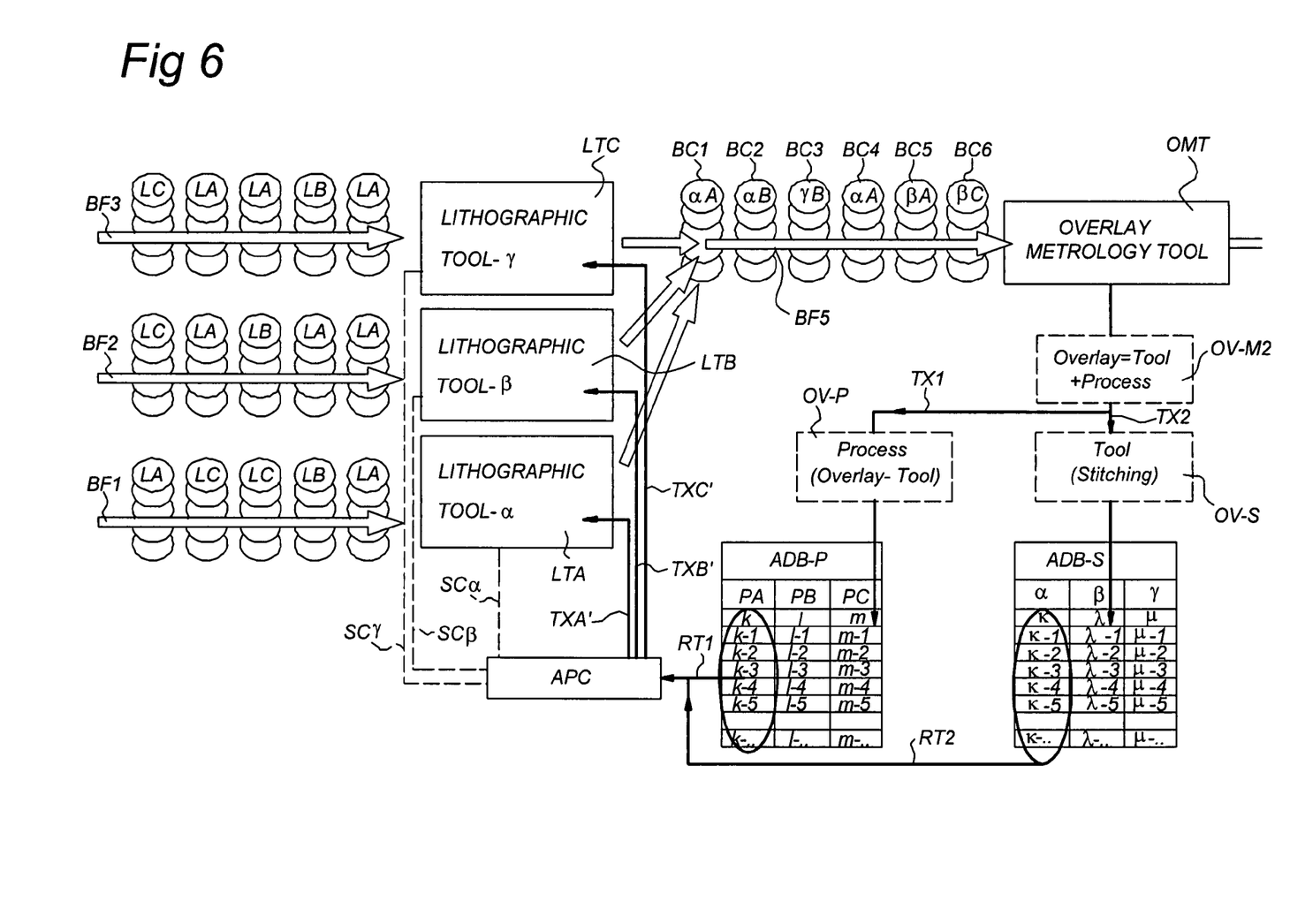
FIG. 6 depicts a schematic diagram of an overlay and stitching metrology system and method in accordance with the present invention.

FIG. 6 depicts a schematic diagram of an overlay and stitching metrology system and method in accordance with the invention.

In FIG. 6, entities with the same reference number refer to identical entities as shown in the preceding figures.

The overlay metrology system and method according to the invention is typically implemented by an automated process control loop within a fabrication facility. An automated process control system APC (or APC tool) may be utilized in the automated process control loop to determine overlay (drift) on one lot (or batch) of substrates and correct for it on a next lot.

In the automated process control loop of the fabrication facility, a plurality of batch flows BF1, BF2, BF3 are arranged. First batch flow BF1 is present for a first set BS1 of a plurality of batches BT1, BT2, BT3, BT4, BT5 of substrates that are to be processed on a first lithographic apparatus LTA.

A second batch flow BF2 is present for a second set BS2 of a plurality of batches BT6, BT7, BT8, BT9, BT10 of substrates that are to be processed on a second lithographic apparatus LTB.

A third batch flow BF3 is present for a third set BS3 of a plurality of batches BT11, BT12, BT13, BT14, BT15 of substrates which are to be processed on a third lithographic apparatus LTC.

For each batch BT1; ... ; BT15 in each set of batches BS1; BS2; BS3 references LA, LB, LC, indicate which product layer is created by the first, second or third lithographic apparatus LTA, LTB, LTC.

After lithographic processing, all batches BT1; ... ; BT15 as processed by the lithographic apparatus LTA, LTB, LTC, are fed into a fifth batch flow BF5, which is directed to the overlay metrology tool OMT.

In the embodiment of FIG. 6, a plurality of different product layers to be created (as referenced by LA, LB and LC) is distinguished. According to the invention, each of the different product layers may be created by using layouts.

These layouts L5, L6 include device portions DL1, DL2 relating to the specific product layer to be created, and scribe lane portions SL5, SL6 with inner and outer overlay boxes OB1, OB2, OB3, OB4, CB1, CB2, CB3, CB4, CB5, CB6, CB7, CB8, CB9, CB10, CB11, CB12.

As explained with reference to FIG. 5, the inner and outer overlay boxes OB1, OB2, OB3, OB4, CB1, CB2, CB3, CB4, CB5, CB6, CB7, CB8, CB9, CB10, CB11, CB12 are arranged for the creation of overlay marks OM1, OM2, OM3, OM4 and non-zero layer stitching overlay marks ST1, ST2, ST3, ST4 in the product layer LA; LB; LC.

After lithographic processing, LP4, LP5, the batches BT1; ... ; BT15 include combinations of the different (product) layers LA, LB, LC with both overlay marks OM1, OM2, OM3, OM4 and non-zero layer stitching overlay marks ST1, ST2, ST3, ST4. In batch flow BF5, a plurality of batches BC1, BC2, BC3, BC4, BC5, BC6 are shown which are processed on one of the first, second and third lithographic apparatus LTA, LTB, LTC and which contains product layer LA, LB, LC. The combination of first lithographic apparatus LTA with product layer LA is denoted αA. The combination of first lithographic apparatus LTA with product layer LB or LC are denoted αB, and αC, respectively.

Similarly, the combination of second lithographic apparatus LTB with product layer LA, LB or LC is denoted βA, βB, and βC, respectively.

The combination of third lithographic apparatus LTC with product layer LA, LB or LC is denoted γA, γB, and γC, respectively.

In the present invention, each processed batch BC1; ... ; BC6 of substrates may be provided with overlay marks OM1, OM2, OM3, OM4 and non-zero layer stitching marks ST1, ST2, ST3, ST4.

The overlay metrology tool OMT may determine for each batch BC1; ... ; BC6 the overlay and stitching overlay for the specific layer αA; αB; αC; βA; βB; βC; γA; γB; γC; created in that batch on one of the lithographic apparatus LTA; LTB; LTC.

In one embodiment, the overlay metrology tool OMT may determine the overlay for each batch with the aid of an enhanced overlay model OV-M2. The value of the determined overlay encompasses both process-related overlay OV-P and performance-related stitching overlay OV-S related to the actual setting of the lithographic apparatus used in the lithographic processing. In the enhanced overlay model OV-M2, the use of overlay marks and non-zero layer stitching marks allows for distinguishing overlay error relating to processing (i.e. manufacturing of a product layer) and overlay error relating to performance of a specific lithographic apparatus, i.e. the performance-related overlay, as described above with reference to FIG. 4.

In accordance with the ability to measure different overlay error types, the overlay metrology tool OMT may transmit determined process-induced overlay values PA; PB; PC related to the processing for each specific product layer LA; LB; LC (arrow TX1) and the determined performance-related overlay values α; β; γ relating to performance of a specific lithographic apparatus LTA; LTB; LTC (arrow TX2) to the automated process control computer system APC.

In another embodiment, the automated process control computer system APC retrieves the overlay results and utilizes the OV-M2 model for distinguishing between process-induced overlay error and performance-related error based on the overlay data determined on both overlay marks OM1, OM2, OM3, OM4 and non-zero layer stitching marks ST1, ST2, ST3, ST4.

The automated process control computer system APC may store the process-induced overlay values PA; PB; PC related to lithographic processing for each specific product layer LA; LB; LC in a first automated process control database ADB-P.

The automated process control computer system APC may store the performance-related overlay values α; β; γ relating to performance of a specific lithographic apparatus LTA; LTB; LTC in a second automated process control database ADB-S.

In the first automated process control database ADB-P, the process-induced overlay PA; PB; PC related to lithographic processing for each specific product layer LA; LB; LC for each batch having product layer LA, LB, LC may be ranked by index k', l', m', respectively, with k', l', m' being the most recent measured overlay values.

In the second automated process control database ADB-S, the performance-related overlay α; β; γ relating to performance of a specific lithographic apparatus LTA; LTB; LTC for each batch having been processed on that lithographic apparatus LTA; LTB; LTC is ranked by index $\epsilon$, $\lambda$, $\mu$, respectively, with $\epsilon$, $\lambda$, $\mu$ being the most recent measured overlay values.

Next, the automated process control computer system APC may use the overlay values PA; PB; PC; $\alpha$; $\beta$; $\gamma$ stored in the first and second automated process control databases ADB-P, ADB-S during lithographic processing on each lithographic apparatus as a function of the actual product layer LA; LB; LC to be created and as a function of the actual lithographic apparatus LTA; LTB; LTC to be used.

The automated process control computer system APC may retrieve the relevant process-induced overlay value(s) PA; PB; PC for a product layer LA; LB; LC from the first automated process control database ADB-P (arrow RT1) in accordance with a schedule for a batch to be processed on a specific lithographic apparatus. The schedule may be schematically indicated by the dashed lines SC$\alpha$, SC$\beta$, SC$\gamma$ between the automated process control computer system APC and the first, second and third lithographic apparatus LTA, LTB, LTC, respectively.

Also, the automated process control computer system APC may retrieve the relevant performance-related overlay value(s) $\alpha$; $\beta$; $\gamma$ for a specific lithographic apparatus to be used for the creation of the product layer from the second automated process control database ADB-S (arrow RT2) in accordance with the schedule for a batch to be processed on a specific lithographic apparatus.

In one embodiment, the automated process control computer system APC may transmit (arrow TXA'; TXB'; TXC') the relevant process-induced and performance-related overlay and stitching overlay data PA, $\alpha$; PB, $\beta$; PC, $\gamma$ to the specific lithographic apparatus LA; LB; LC.

In another embodiment, the automated process control computer system APC may determine a combined overlay effect of a process-induced overlay correction and a performance-related overlay correction, the combined overlay effect being transmitted to the lithographic apparatus.

Note that, although in this embodiment two automated process control databases ADB-P, ADB-S are shown, mainly for reason of clarity, it is possible to use a single automated process control database in which both types of overlay errors may be stored.

Note also that the data in the first and second automated process control databases ADB-P, ADB-S are shown here in tabulated formats. It will be apparent to persons skilled in the art that a different (logical) ranking within the database(s) is possible without departure from the intended function and use of the database(s).

Figure 7:
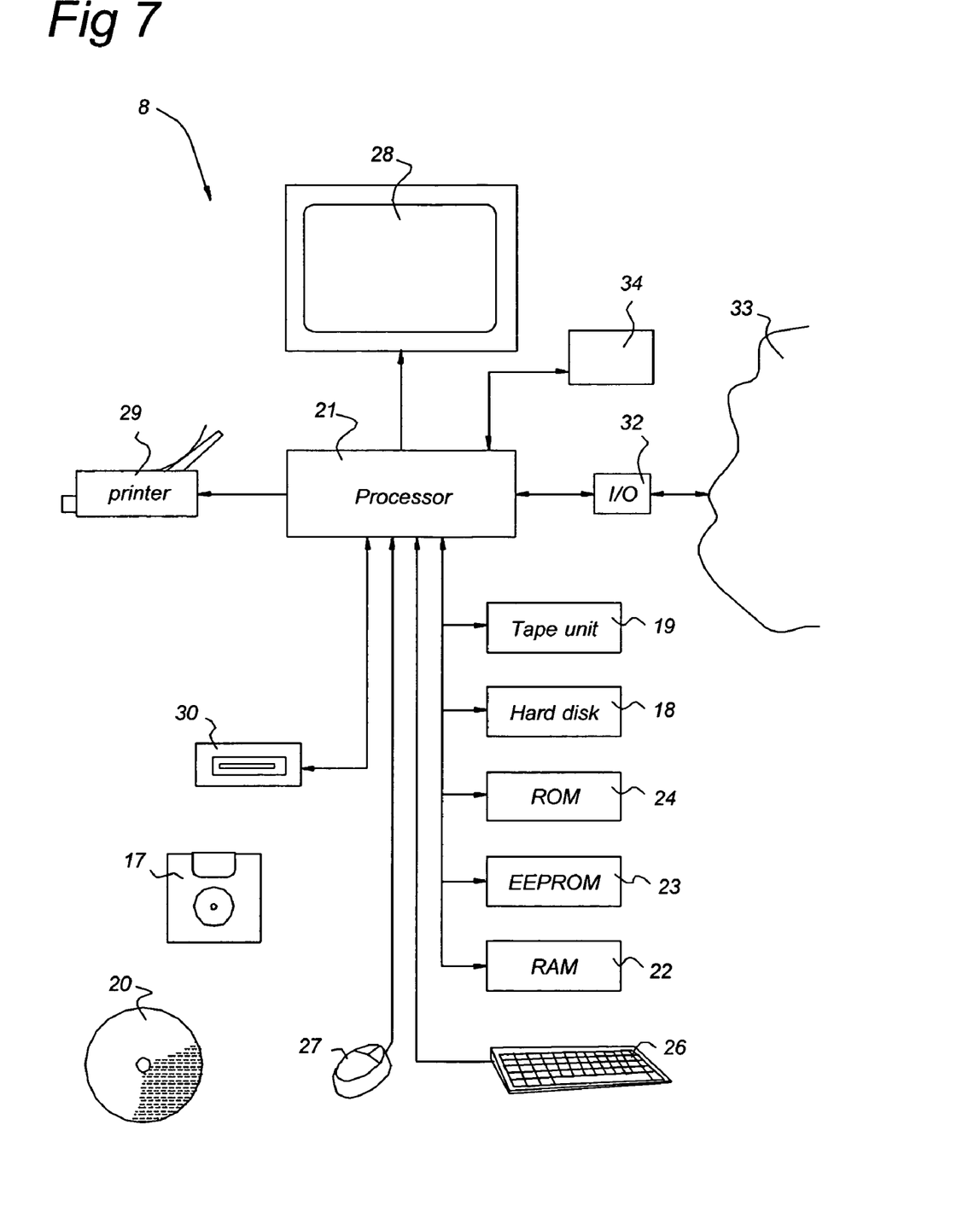
FIG. 7 depicts an automated process control system in accordance with the present invention.

FIG. 7 depicts an automated process control computer system in accordance with the present invention.

Automated process control computer system 8 includes host processor 21 with peripherals. The host processor 21 may be connected to one or more memory units 18, 19, 22, 23, 24 which store instructions and data, one or more reading units 30 (to read, e.g., floppy disks 17, CD ROM's or DVD's 20, etc.), a keyboard 26 and a mouse 27 as input devices, and as output devices, a monitor 28 and a printer 29. Other input devices, including a trackball, a touch screen or a scanner, as well as other output devices may be provided.

The memory units shown include RAM 22, (E)EPROM 23, ROM 24, tape unit 19, and hard disk 18. However, it should be understood that there may be provided more and/or other memory units known to persons skilled in the art. Additionally, one or more of them may be physically located remote from the processor 21.

The processor 21 is shown as one box, however, it may comprise several processing units functioning in parallel or controlled by one main processor. The processing units may be located remotely from one another, as is known to persons skilled in the art, for example in a network topology.

The automated process control computer system APC may be connected to a computer system (not shown) of each lithographic apparatus LTA, LTB, LTC and to the overlay metrology tool OMT. The connection between the computer system 8 of the automated process control computer system APC and the computer system of each lithographic apparatus LTA, LTB, LTC and the overlay metrology tool OMT may be direct or arranged over a network (not shown). In case of a connection over a network, the network may be a local area network, and also may comprise telecommunication networks. The connection of the computer system of the automated process control system APC to the computer system of each lithographic apparatus LTA, LTB, LTC and to the overlay metrology tool OMT may be embodied in any way known to persons skilled in the art, e.g., by wire or wireless.

The first and second automated process control databases ADB-P and ADB-S are typically stored in one or more of the memory units 18, 19, 22, 23, 24.

The processor 21 of the automated process control computer system APC is capable of executing software code that implements the method of the present invention. The computer system 8 shown in FIG. 7 is arranged to perform the steps of the method of the present invention as described above.

The computer system 8 is capable of receiving from the overlay metrology tool OMT process-induced overlay values PA; PB; PC relating to the processing for each specific product layer LA; LB; LC and also performance-related overlay values $\alpha$; $\beta$; $\gamma$ that relate to the performance of the lithographic apparatus LTA; LTB; LTC, respectively.

Subsequently, the computer system 8 may be capable of storing the aforementioned overlay values PA; PB; PC and overlay values $\alpha$; $\beta$; $\gamma$ in the first and second automated process control database ADB-P and ADB-S, respectively.

Next, the computer system 8 is capable of receiving from the lithographic apparatus LTA; LTB; LTC a batch identification signal relating to the batch BT1; . . . ; BT15 to be processed on the specific lithographic apparatus.

In response, the automated process control computer system APC is capable of identifying the batch to be processed from the received batch information signal. For the batch BT1; . . . ; BT15 to be processed, it will be known which product layer LA; LB; LC is to be produced by the lithographic processing.

The automated process control computer system APC is capable of retrieving process-induced overlay value information PA; PB; PC relating to the processing for the specific product layer LA; LB; LC from the first automated process control database ADB-P and also performance-related overlay values $\alpha$; $\beta$; $\gamma$ relating to the performance (stitching overlay) of the specific lithographic apparatus LTA; LTB; LTC from the second automated process control database ADB-S.

In a next action, the automated process control computer system APC is capable of sending the process-induced overlay values PA; PB; PC and performance-related overlay values $\alpha$; $\beta$; $\gamma$, as requested by the batch information signal, to the lithographic apparatus that sent the batch information signal originally.

It is noted that the automated process control computer system APC may have capabilities for processing the data of the overlay values and stitching overlay values in the first and second automated process control databases, respectively, according to rules relating to, for example, statistical analysis or a computational model. In this way, a running average or a correction based on a physical model may be established for the overlay values and/or the stitching overlay values. A skilled person will recognize that these and/or alternative data processing rules may be performed on the overlay and stitching overlay values before sending them to the lithographic apparatus requesting for such overlay and stitching overlay value data.

Preferably, the automated process control system APC uses processing rules for first determining a combined overlay effect of a process-induced overlay correction and a performance-related overlay correction and then transmitting the value(s) of the combined overlay effect to the lithographic apparatus.

The overlay metrology tool OMT may comprise a computer system in accordance with FIG. 7 as well.

Such a computer system of an overlay metrology tool OMT is capable of at least the following actions after measuring the overlay values of the overlay marks between the layer N-1 and the layer N and the stitching overlay values of the stitching overlay marks in layer N:

establishing through an enhanced overlay model OV-M2 from measured overlay value data on overlay marks and from measured stitching overlay value data on non-zero layer stitching overlay marks, process-induced overlay values PA; PB; PC relating to processing for each specific product layer LA; LB; LC, and performance-related overlay values $\alpha$; $\beta$; $\gamma$ that relate to the performance (stitching overlay) of the lithographic apparatus LTA; LTB; LTC, respectively, and sending the established process-induced overlay values PA; PB; PC and performance-related overlay values $\alpha$; $\beta$; $\gamma$, in relation to the specific product layer and the specific lithographic apparatus, to the automated process control computer system APC.

As will be appreciated by a person skilled in the art, the lithographic apparatus LTA; LTB; LTC may also include a computer system that resembles the computer system of FIG. 7. Such a computer system may be capable of identifying a batch to be processed;

sending a batch information signal to the automated process control system APC to request data relating to the process-induced overlay values PA; PB; PC relating to the product layer LA; LB; LC to be processed and performance-related overlay values $\alpha$; $\beta$; $\gamma$ relating to the stitching overlay performance of the lithographic apparatus LTA; LTB; LTC itself;

receiving from the automated process control system APC the process-induced overlay values for the batch to be processed PA; PB; PC and the performance-related overlay values $\alpha$; $\beta$; $\gamma$ relating to the lithographic apparatus LTA; LTB; LTC itself, and adjusting its scanner properties in accordance with the process-induced overlay values PA; PB; PC and performance-related overlay values $\alpha$; $\beta$; $\gamma$.

In yet another embodiment, the control loop as described above with reference to FIG. 6 may include a fab wide automation system MES which is dedicated to identifying a location of a batch within the fab. This MES system may be connected to both the lithographic apparatus within the fab and the automated process control computer system APC. The MES system may report to the lithographic apparatus which batch is next in line for lithographic processing and communicate with the automated process control computer system APC to compute optimum corrections for overlay in relation to the particular lithographic apparatus and the particular product layer to be processed on the identified batch. In this embodiment, the fab wide automation system MES acts as an intermediate between the automated process control computer system APC and the lithographic apparatus in the automated process control loop. The automated process control computer system APC reports (communicates) process-induced overlay and performance related overlay or the combined effect of process-induced overlay and performance related overlay as computed optimum corrections for overlay to the fab wide automation system MES. In turn the fab wide automation system MES may communicate the computed optimum corrections for overlay to the particular lithographic apparatus. The lithographic apparatus may apply the computed optimum corrections for overlay as correction values for overlay during lithographic processing.

The invention advantageously enables the following applications:

From any batch of substrates, the tool induced shift (performance-related overlay) may be controlled very accurately via the automated process control computer system APC since the amount of data from this tool (lithographic apparatus) is greatly enhanced: all batches contribute to the trend. This provides an option to adapt periodic maintenance to just-in-time maintenance.

Introducing real process corrections and tool corrections by computed optimum corrections in an automated process control computer system APC or, in general, in an automated process control loop will improve both the single machine overlay as well as the matched machine overlay (i.e., between two lithographic apparatus). Either the overlay benefit may be commercialized or a more flexible operation (matched machine instead of single machine operation) may be enabled.

Furthermore, this invention enables a better determination of the process-induced alignment shift (process-induced overlay) for development purposes by subtracting the tool induced shifts from the overlay data.

The performance-related overlay enables the customer to fine tune the offline overlay metrology tool OMT. Based on the stitching overlay data, one may subtract the enhanced overlay model OV-M2 and look at the residuals of the measured data. In case the residuals are larger than a few nanometers, say 1-2 nm, the offline overlay metrology tool OMT may be fine tuned (i.e., the invention provides a trigger for preventive maintenance of metrology tools).

Moreover, when a user is willing to sample more dies on the overlay tool the following applications can be created:

Accurate die-to-die offsets control per tool can be introduced per lithographic apparatus. Conventionally, a user ran special tests with special wafers to determine possible die-to-die offsets. The method according to the invention enables the user to determine the die-to-die offsets on product wafers without affecting lithographic apparatus throughput.

Although specific reference may be made herein to the use of overlay metrology tools using "box-in-box" structures to measure overlay, it should be understood that this invention is not limited to the described overlay measurement technique as such. Other overlay metrology methods like scatterometry, use of acoustical waves, or others are also included. Tools based on these other overlay metrology methods may be remote from the lithography equipment, but may also be embedded in the lithography equipment. Other overlay measurement techniques like "bar-in-bar" are also included in this application.

Although specific reference may be made herein to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquidcrystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist may be cured by applying electromagnetic radiation, heat, pressure or a combination thereof. The patterning device may be moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of determining an overlay alignment between a first layer layout and a second layer layout that are manufactured on a target portion of a substrate by lithographic processing, wherein the substrate includes a plurality of adjacent target portions, wherein the method comprises:

forming at least one first overlay portion on the first layer layout;

forming at least one first complementary overlay portion on the second layer layout, wherein the at least one first overlay portion and the at least one first complementary overlay portion are arranged to form an overlay mark;

forming a stitching overlay portion on the second layer layout;

forming a complementary stitching overlay portion on the second layer layout;

exposing the second layer layout on the target portion of the substrate;

exposing the second layer layout on at least one of the plurality of adjacent target portion that is located adjacent to the target portion;

forming a stitching overlay mark from the exposure of the stitching overlay portion and the complementary stitching overlay portion;

determining a stitching overlay for the target portion of the substrate;

exposing the first layer layout over the second layer layout; and determining an overlay alignment of the first layer layout and the second layer layout.

2. The method according to claim 1, further comprising:

determining, from the overlay of the first and second layer layouts and the stitching overlay, a process-induced overlay value that corresponds to a manufacture of the first and second layer layouts.

3. The method according to claim 1, further comprising:

determining, from the overlay of the first and second layer layouts and the stitching overlay, a performance-related overlay value that corresponds a performance of a lithographic apparatus involved in the manufacture of the second layer layout.

4. The method according to claim 1, further comprising:

determining, from the overlay of the first and second layer layouts and the stitching overlay, a combined effect of a process-induced overlay value that corresponds to a manufacture of the first and second layer layouts and a performance-related overlay value that corresponds to a performance of a lithographic apparatus involved in the manufacture of the second layer layout.

5. The method according to claim 1, wherein the at least one first overlay portion is positioned in the first layer layout at a first location that substantially coincides with a second location of the at least one first complementary overlay portion in the second layer layout.

6. The method according to claim 1, wherein the stitching overlay portion is located at a third location in the second layer layout which is substantially mirrored over a coordinate axis-line with respect to a fourth location of the complementary stitching overlay portion in the second layer layout.

7. The method according to claim 1, wherein the at least one first overlay portion is located in a first scribe lane portion of the first layer layout and the at least one first complementary overlay portion is located in a second scribe lane portion of the second layer layout.

8. The method according to claim 1, wherein the first layer layout comprises a first device layout portion and the second layer layout comprises a second device layout portion.

* * * * *